(12) United States Patent
Jefferson et al.

(10) Patent No.: US 6,215,326 B1
(45) Date of Patent: Apr. 10, 2001

(54) PROGRAMMABLE LOGIC DEVICE ARCHITECTURE WITH SUPER-REGIONS HAVING LOGIC REGIONS AND A MEMORY REGION

(75) Inventors: David E. Jefferson, San Jose; Cameron McClintock, Mountain View; James Schleicher, Santa Clara; Andy L. Lee, San Jose; Manuel Mejia, San Jose; Bruce B. Pedersen, San Jose; Christopher F. Lane, Campbell; Richard G. Cliff, Milpitas; Srinivas T. Reddy, Fremont, all of CA (US)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 09/266,235

(22) Filed: Mar. 10, 1999

Related U.S. Application Data

(60) Provisional application No. 60/109,417, filed on Nov. 18, 1998.

(51) Int. Cl.[7] .................................................. H03K 19/177
(52) U.S. Cl. ................................................. 326/41; 326/38
(58) Field of Search ................................. 326/41, 40, 47, 326/38, 39

(56) References Cited

U.S. PATENT DOCUMENTS

| | | | | |
|---|---|---|---|---|
| 5,689,195 | * | 11/1997 | Cliff et al. | 326/41 |
| 5,796,269 | * | 2/2000 | New | 326/40 |
| 6,020,759 | * | 2/2000 | Heile | 326/40 |
| 6,091,263 | * | 7/2000 | New et al. | 326/40 |

* cited by examiner

Primary Examiner—Michael Tokar
Assistant Examiner—James H. Cho
(74) Attorney, Agent, or Firm—Fish & Neave; Robert R. Jackson

(57) ABSTRACT

A programmable logic device has a plurality of super-regions of programmable circuitry disposed on the device in a two-dimensional array of such super-regions. Each super-region includes a plurality of regions of programmable logic and a region of programmable memory. Each logic region includes a plurality of subregions of programmable logic. Each super-region has associated interconnection resources for allowing communication between the logic and memory regions of that super-region without the need to use, for such relatively local interconnections, the longer-length inter-super-region interconnection resources that are also provided on the device.

20 Claims, 14 Drawing Sheets

PROGRAMMABLE LOGIC DEVICE ARCHITECTURE WITH SUPER-REGIONS HAVING LOGIC REGIONS AND A MEMORY REGION

This application claims the benefit of provisional patent application Ser. No. 60/109,417, filed Nov. 18, 1998, which is hereby incorporated by reference herein in its entirety.

BACKGROUND OF THE INVENTION

This invention relates to programmable logic integrated circuit devices, and more particularly to the organization of various types of resources (e.g., logic, memory, and interconnection conductors) on such devices.

It is known to provide programmable logic integrated circuit devices with blocks of programmable logic, blocks of memory (e.g., random access memory ("RAM") or read-only memory ("ROM")) that are accessible to the user, and programmable interconnection conductor resources for selectively conveying signals to, from, and between the logic and memory blocks (see, for example, Cliff et al. U.S. Pat. No. 5,550,782 and Cliff et al. U.S. Pat. No. 5,689,195, both of which are hereby incorporated by reference herein in their entireties). The logic blocks are programmable by the user to perform various logic functions desired by the user. The memory blocks may be used by the user to store and subsequently output data or to perform various logic functions desired by the user. The interconnection conductor resources are programmable by the user to make any of a wide range of connections between inputs of the device and inputs of the logic and memory blocks, between outputs of the logic and memory blocks and outputs of the device, and between outputs and inputs of the logic and memory blocks. Although each individual logic module (of which there may be several in each logic block) and memory block is typically able to perform only a relatively small logic or memory task, the interconnection conductor resources allow concatenation of these individual logic and memory tasks so that extremely complex functions can be performed if desired.

Improvements in integrated circuit fabrication technology are making it possible to make programmable logic devices with very large amounts of logic, memory, and interconnection conductor resources. Increasing the amounts of logic and memory on a programmable logic device has a tendency to call for more than a proportional increase in the amount of interconnection conductor resources provided. This is so because, at least in theory, it is desirable to be able to connect any inputs and outputs on the device to one another without other possibly desired connections being blocked or prevented. As the number of logic and memory blocks on the device increases, the number of inputs and outputs increases in approximately linear proportion. But the number of possibly desired connections between inputs and outputs tends to increase in a more exponential fashion. This can lead to excessive amounts of the total resources of the device being devoted to interconnection conductors and associated circuitry.

In view of the foregoing, it is an object of this invention to provide organizations for large programmable logic devices that help to reduce the need for excessive amounts of interconnection conductor resources on those devices.

It is a more particular object of this invention to provide arrangements for the logic and memory blocks on large programmable logic devices which facilitate provision of large amounts of anticipated interconnections on a "local" basis, using relatively short interconnection conductors, so that the amount of more "expensive" longer-length interconnection resources can be reduced, thereby helping to limit the fraction of overall device resources that must be devoted to interconnection resources.

SUMMARY OF THE INVENTION

These and other objects of the invention are accomplished in accordance with the principles of the invention by providing programmable logic devices having a plurality of super-regions (each including programmable logic and memory) disposed on the device in a two-dimensional array of intersecting rows and columns of such super-regions. Each super-region includes a plurality of regions of programmable logic and a region of memory. Each logic region includes a plurality of subregions of programmable logic. Each subregion is programmable to perform any of several relatively elementary logic functions on a plurality of input signals applied to that subregion in order to produce at least one subregion output signal. Each memory region has a plurality of memory inputs via which signals can be applied to the memory (e.g., for use in writing to or reading from the memory). Each memory region also has a plurality of outputs via which signals can be output by the memory.

A first level of interconnection conductor resources is provided within each super-region for communicating between adjacent subregions in that super-region. (In some cases the first level interconnection conductors also allow communication with a memory region if such a region is adjacent to those first level interconnection resources.) A second level of interconnection conductor resources is provided within each super-region for longer-distance communication within that super-region (e.g., between logic regions and memory regions in the super-region). A third level of interconnection conductor resources is provided on the device for communication to, from, and between the super-regions.

Inclusion of a memory region in each super-region helps reduce the need to use the third level of interconnection conductor resources. For example, each memory region can work with the logic regions of the super-region that includes that memory region by using only the first and second level interconnection conductor resources of that super-region. This is illustrative of the ways in which the programmable logic device organizations ("architectures") of this invention help reduce or at least hold down overall interconnection resource requirements on large programmable logic devices.

Further features of the invention, its nature and various advantages will be more apparent from the accompanying drawings and the following detailed description of the preferred embodiments.

DETAILED DESCRIPTION OF THE PREFERRED EMBODIMENTS

Figure 1:
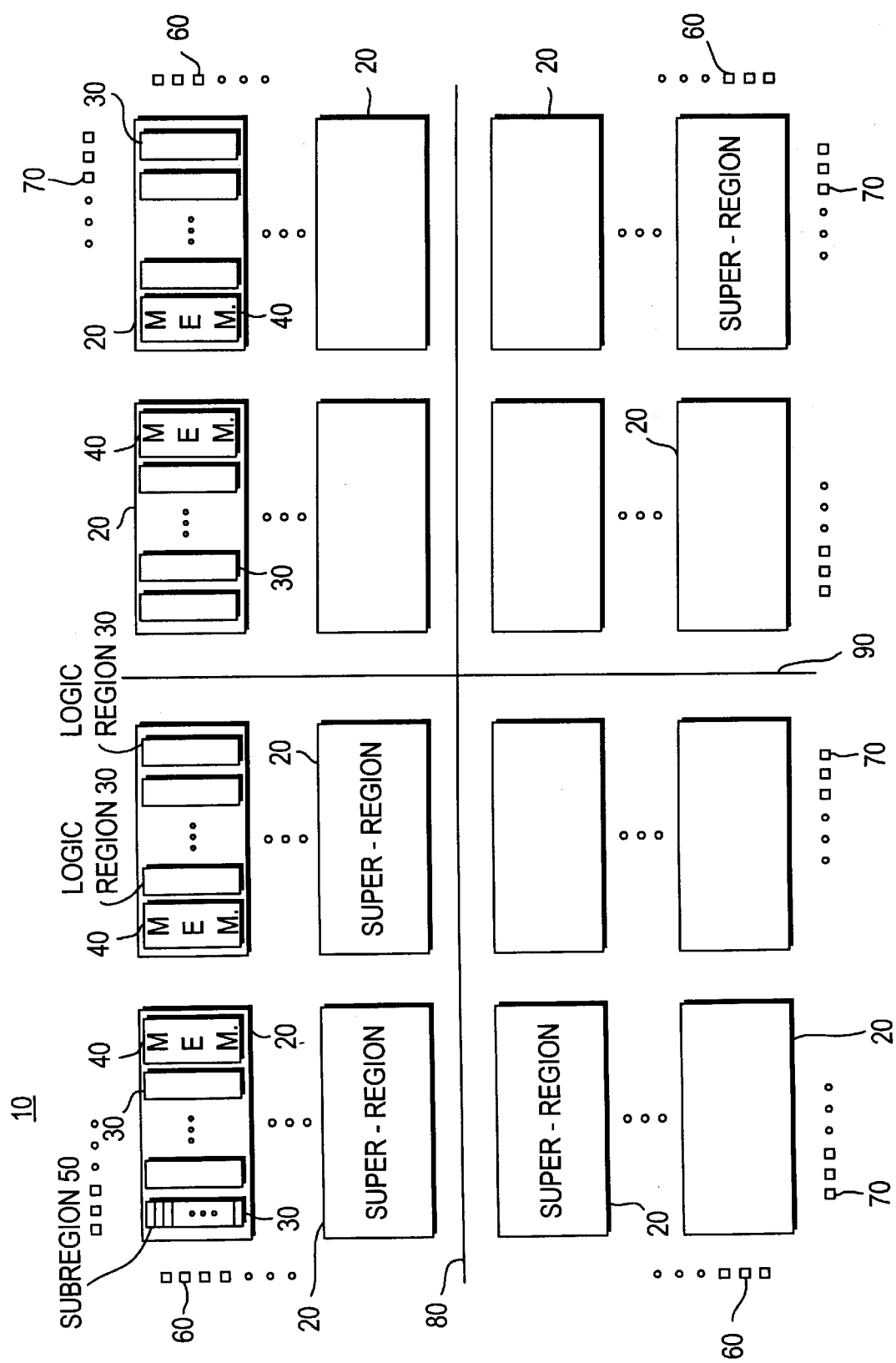
FIG. 1 is a simplified block diagram of representative portions of an illustrative programmable logic array integrated circuit device constructed in accordance with the invention.

As shown in FIG. 1, an illustrative programmable logic device 10 constructed in accordance with this invention includes 112 super-regions 20 of programmable logic and memory disposed on the device in a two-dimensional array of 28 rows and four columns of super-regions. Each row includes four super-regions and each column includes 28 super-regions. The fourteenth row from the top is a "spare" row that is used only when it is necessary to make up for a defect in one of the thirteen rows above that spare row. Similarly, the fourteenth row from the bottom is a spare row that is used only when it is necessary to make up for a defect in one of the thirteen rows below that spare row. A certain amount of "redundancy" is thus provided on device 10.

Each super-region 20 includes a row of 16 regions 30 of programmable logic and one region 40 of memory, which the user of device 10 can use as RAM, ROM, etc.

Each logic region 30 includes a column of ten subregions 50 of programmable logic. To avoid over-crowding FIG. 1, only the extreme upper left-hand logic region 30 has its subregions 50 shown separately.

FIG. 1 also shows that each row of super-regions 20 (except the spare rows) has "horizontal" input/output ("I/O") pins 60 adjacent each end of the row. The top-most and bottom-most rows have four I/O pins 60 adjacent each end, while all the other non-spare rows have five I/O pins 60 adjacent each end. "Vertical" I/O pins 70 are similarly provided at each end of each column of logic regions 30. In general, two I/O pins 70 are provided at each end of each such column, except that in each super-region column only one I/O pin 70 is provided at each end of the extreme left-most and right-most column of logic regions 30.

In FIG. 1 the horizontal line 80 and the vertical line 90 divide the circuitry into four equal-sized quadrants. Lines 80 and 90 represent segmentation buffers in certain interconnection conductors as will be shown and described in more detail below.

Figure 2:
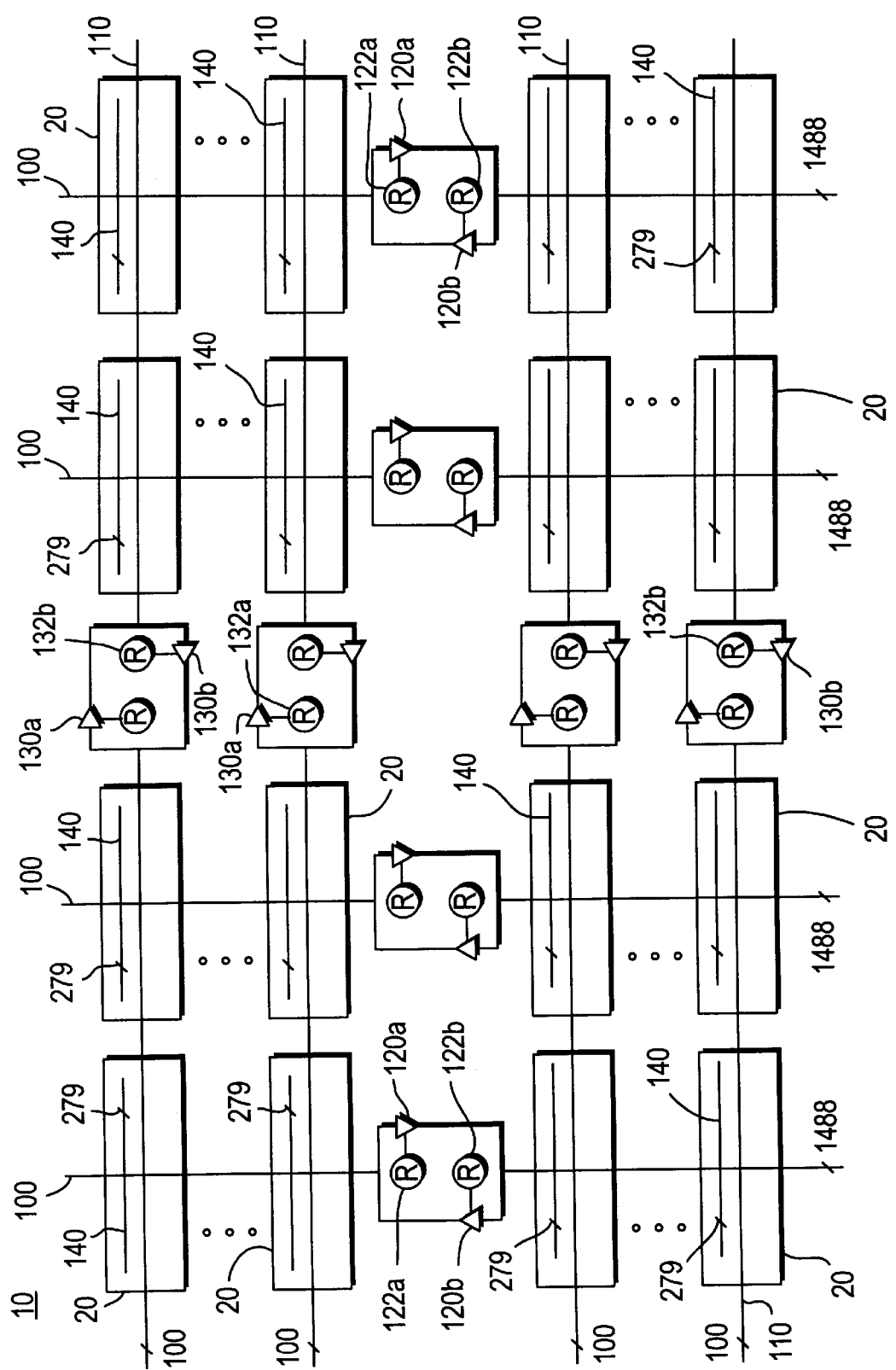
FIG. 2 is a simplified schematic block diagram of representative portions of the FIG. 1 device showing additional features of that device.

FIG. 2 is an over-view of the higher levels in the interconnection conductor resources on device 10. FIG. 2 shows that there are vertical conductors 100 associated with each column of super-regions 20 and horizontal conductors 110 associated with each row of super-regions 20. For example, there may be 80 vertical conductors 100 associated with each column of logic regions 30 (FIG. 1) and 208 vertical conductors 100 associated with each column of memory regions 40 (FIG. 1). There may be 100 horizontal conductors 110 associated with each row of super-regions 20. Vertical conductors 100 allow communication to, from, and between the super-regions 20 in the associated super-region column. Horizontal conductors 110 allow communication to, from, and between the super-regions 20 in the associated super-region row.

Each vertical conductor 100 is segmented at its midpoint by programmable segmentation buffers 120a and 120b. Each segmentation buffer 120 is controlled by an associated programmable function control element ("FCE") 122a or 122b. The FCEs 122 associated with a vertical conductor 100 can be programmed to disable both of the associated buffers 120, in which case each half of the conductor 100 can be used separately and independently. Alternatively, either one of the FCEs 122 associated with a conductor 100 can be programmed to enable the associated buffer 120, in which case one half of the conductor drives the other half. For example, if the buffer 120a of a conductor 100 is enabled, the upper half of that conductor drives the lower half. In this way the two halves of a conductor 100 can be used together.

Each horizontal conductor 110 is similarly segmented at its midpoint by segmentation buffers 130a and 130b, respectively controlled by FCEs 132a and 132b. Operating in the same way as elements 120 and 122, elements 130 and 132 allow each half of a conductor 110 to be used separately, or allow either half of such a conductor to drive the other half.

FIG. 2 also shows that each super-region 20 as a plurality of "global horizontal" conductors 140 or conveying signals to, from, and between the logic and memory regions 30 and 40 (FIG. 1) in the associated super-region. (Although conductors 140 are sometimes called "global" because they span all the regions 30 and 40 in the associated super-region 20, from a larger perspective they are actually less global than above-described conductors 100 and 110, which span multiple super-regions 20.) In the particular embodiment being described there are 279 conductors 140 uniquely or exclusively associated with each super-region 20.

Figure 3:
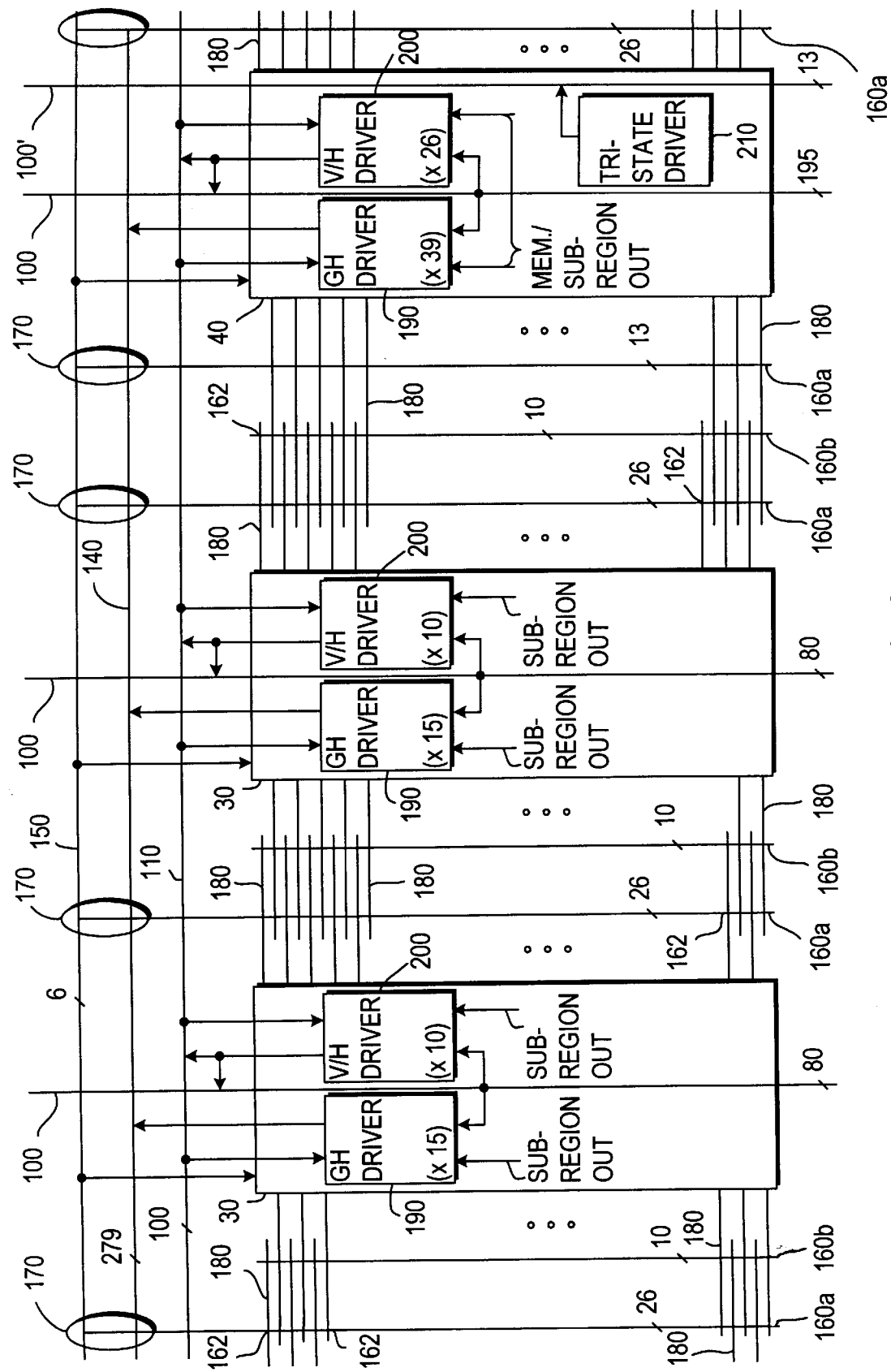
FIG. 3 is a more detailed but still simplified schematic block diagram of representative portions of the FIG. 1 device showing still more features of that device.

FIG. 3 shows the interconnectivity within a typical super-region 20. Local conductors, in general of two different kinds 160a and 160b, extend along each side of each logic or memory region 30 or 40 (FIG. 1). Local conductors 160a are region-feeding conductors that bring signals from associated conductors 140 and 150 into closer proximity to the inputs of the adjacent logic or memory regions 30/40 (FIG. 1). Conductors 150, which have not been previously mentioned, are part of a network of clock and "fast" conductors that extends throughout device 10 in order to provide universal or at least wide availability of signals such as clocks, clears, and/or other signals that may be needed at many locations on the device. Programmable logic connectors ("PLCs") 170 are provided for programmably selectively connecting conductors 140/150 to conductors 160a. Local conductors 160b are local feedback conductors for making available to adjacent or nearby subregions 50 (FIG. 1) the output signals of each subregion 50. Conductors 180 are provided for selectively applying signals from conductors 160 to the inputs of the adjacent logic or memory regions 30/40 (FIG. 1). Although not shown in FIG. 3 (to avoid over-crowding the drawing), PLCs are provided for programmably selectively connecting intersecting conductors 160 and 180. Thus intersections between conductors 160 and 180 represent these PLCs. A few representative ones of these intersections are numbered 162.

The outputs of logic and memory regions 30/40 (FIG. 1) are applied to various types of drivers, some of which are shown in FIG. 3. Not shown in FIG. 3 (but shown elsewhere) are drivers for selectively applying logic and memory region outputs to adjacent local feedback conductors 160b. Other drivers 190 associated with each region 30/40 (FIG. 1) selectively apply region outputs, as well as signals from adjacent conductors 100 and 110, to adjacent conductors 140. Still other drivers 200 associated with each region 30/40 (FIG. 1) selectively apply region outputs, as well as signals from adjacent conductors 100 and 110, to other adjacent conductors 100 and 110.

FIG. 3 also shows that the conductors 100 associated with each column of memory regions 40 (FIG. 1) are divided into two groups: regular conductors 100 and tri-state conductors 100'. Each memory region 40 in a column has a tri-state driver 210 for programmably selectively applying an output of that memory region to selected ones of the tri-state conductors 100' associated with that column. Drivers 210 and conductors 100' are used when several memory regions in a column are being used together to provide a deeper memory than can be provided by one memory region alone. See Pedersen U.S. patent application Ser. No. 09/023,251, filed Feb. 13, 1998, for additional information regarding this type of use of several memory regions together. The just-mentioned Pedersen reference is hereby incorporated by reference herein in its entirety.

Figure 4:
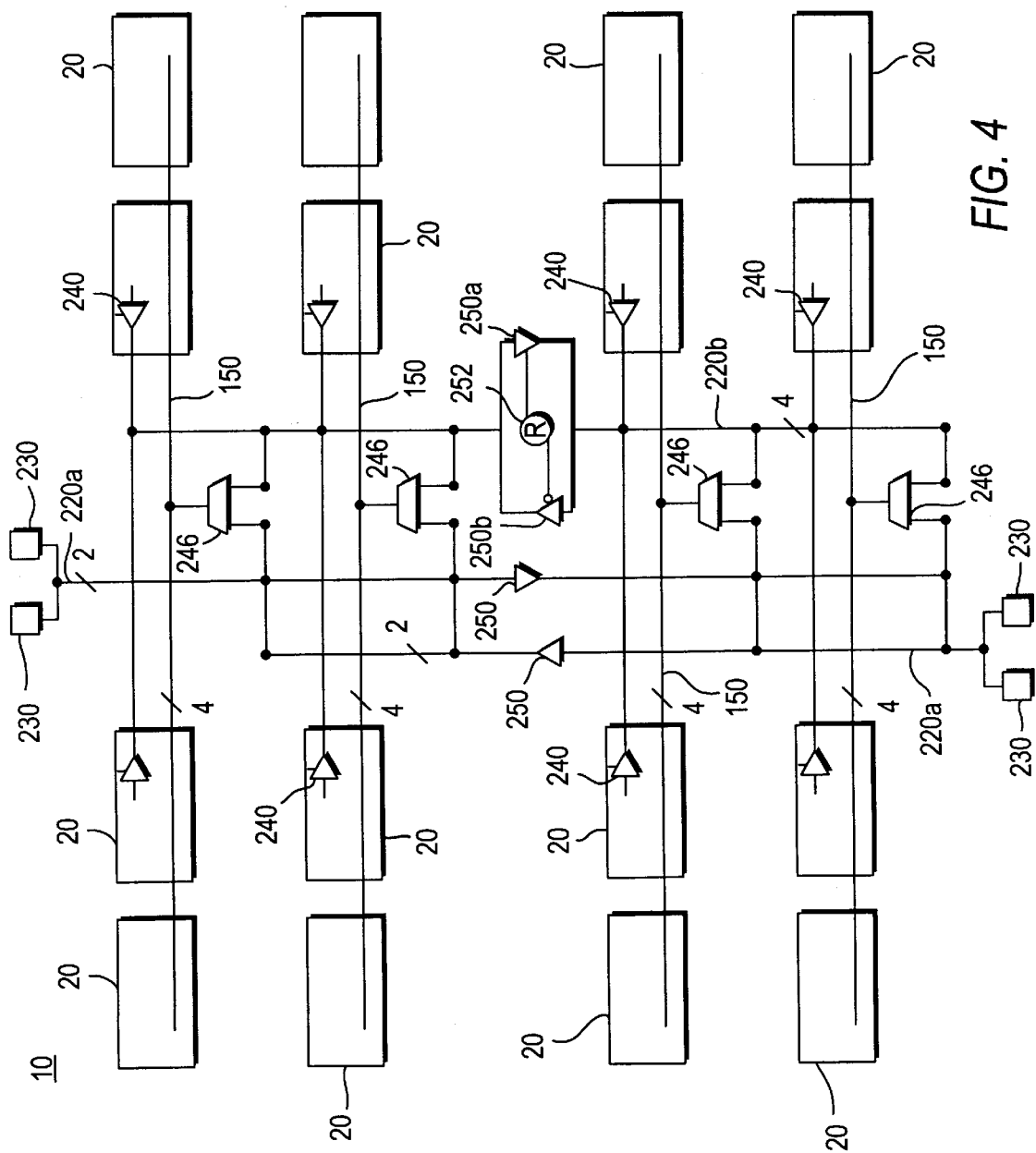
FIG. 4 is a more detailed but still simplified schematic block diagram of representative portions of the FIG. 1 device showing still other features of that device.

FIG. 4 is a further depiction of the network of fast conductors shown in part by conductors 150 in FIG. 3. (FIG. 4 does not show the clock conductors that are among the conductors 150 shown in FIG. 3.) Eight fast trunk conductors 220a/b extend vertically across device 10. Four of these trunk conductors 220a extend from dedicated fast input pins 230. The other four trunk conductors 220b can be driven from tri-state drivers 240 in super-regions 20 to the left and right of those conductors. PLCs 246 are provided for each row of super-regions 20 for applying to each of the fast conductors 150 associated with that row a signal from either one of the conductors 220a driven from a pin 230 or one of the conductors 220b driven from a tri-state driver 240. Each of conductors 220a/b has a buffer 250 at its midpoint. In the case of each conductor 220b that is drivable from a tri-state driver 240, buffers 250a and 250b are provided in each direction, and an FCE 252 is provided for programmably enabling one of those drivers while disabling the other driver.

Figure 5:
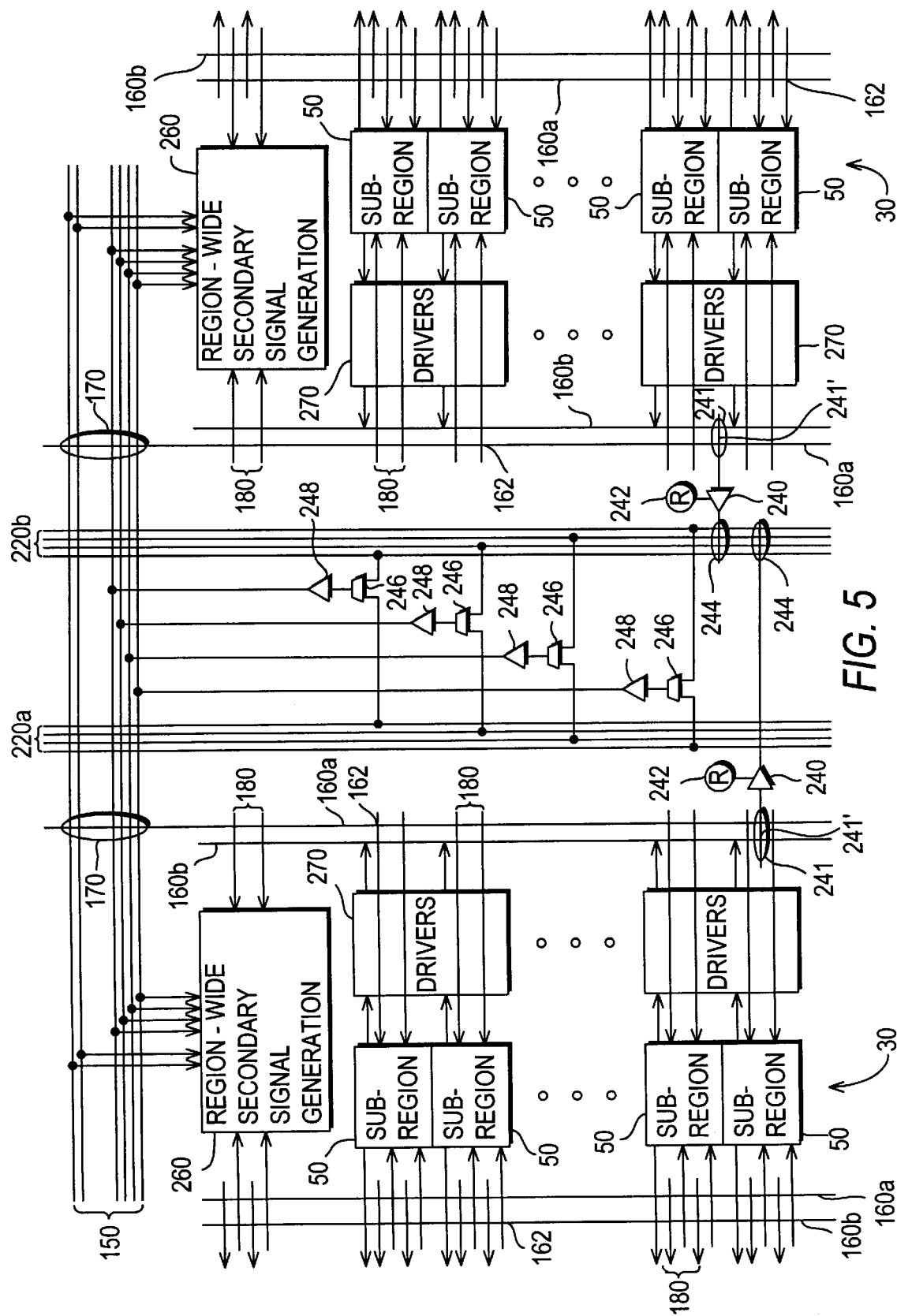
FIG. 5 is a more detailed but still simplified schematic block diagram of representative portions of the FIG. 1 device showing even further features of that device.

FIG. 5 shows additional details of the clock and fast conductor network. In particular, FIG. 5 shows that each of tri-state drivers 240 gets its input signal from any of the conductors 160a and 160b that are closest to the center of device 10 (and therefore to conductors 220b) and that are adjacent to that driver. PLCs 241 and a conductor 241' supply the input signal to each driver 240. Each driver 240 is controlled by an associated FCE 242. The output of each driver 240 is applied to one or more of the associated conductors 220b by PLCs 244.

FIG. 5 also shows circuitry 260 associated with each region for deriving so-called secondary signals for the region from among two clock and four fast conductors 150 and four inputs 180 from the adjacent conductors 160. These secondary signals are used for controlling registers in the subregions 50 of the associated region 30. For example, the secondary signals provide signals such as clocks and clears that may be needed by the registers.

Figure 7:
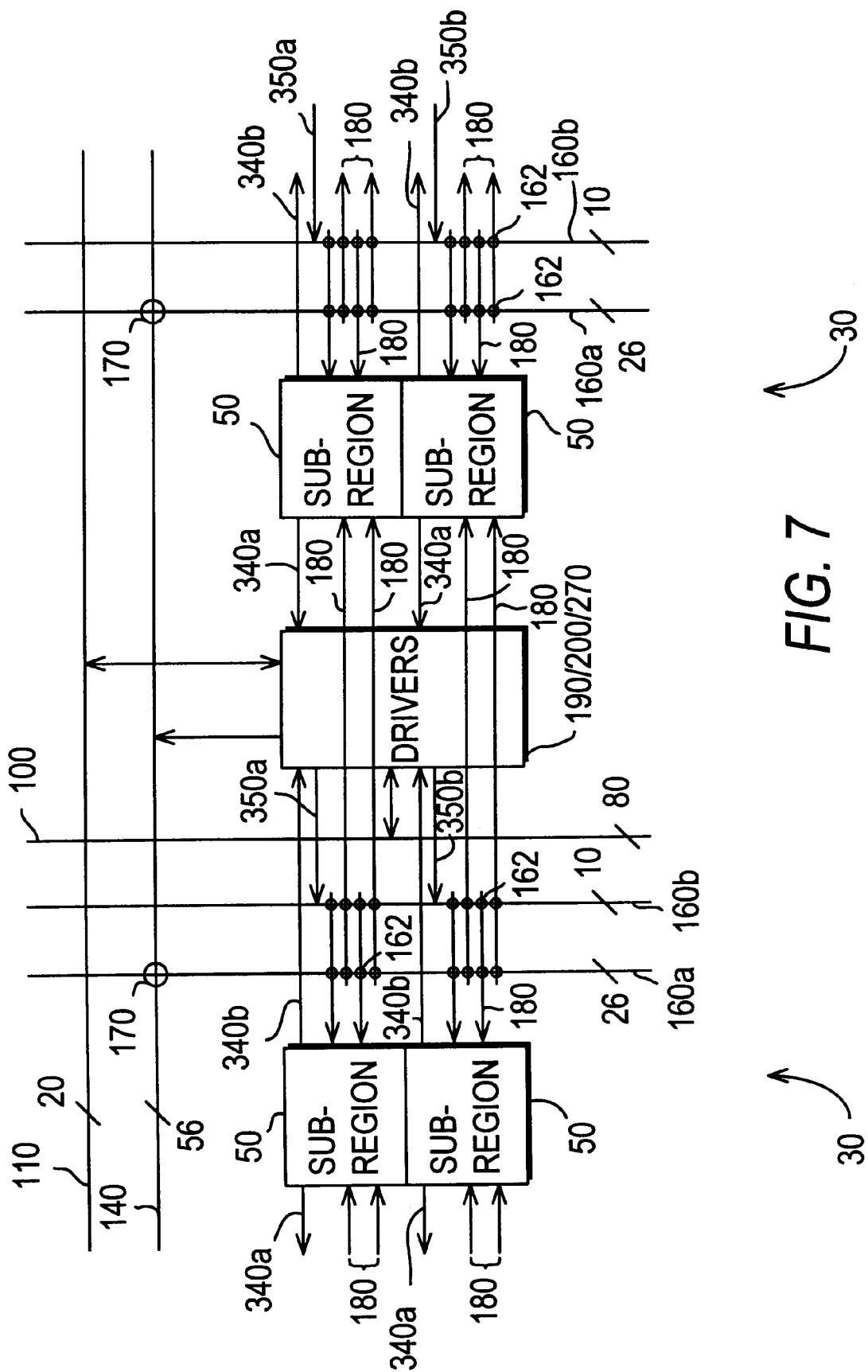
FIG. 7 is a more detailed but still simplified schematic block diagram of a representative portion of the FIG. 1 device showing still other aspects of that device.

FIG. 5 still further shows the drivers 270 that are used to drive subregion outputs onto the adjacent local feedback conductors 160b. More typical examples of drivers 270 are shown in FIG. 7, and so further discussion of these drivers is deferred until that FIG. is considered.

The two clock conductors 150 shown in FIG. 5 (i.e., the top two horizontal conductors in FIG. 5) are part of a clock conductor network that extends throughout device 10 from two dedicated clock input pins. It is not believed necessary to provide a more extensive depiction or description of the clock conductor network because that network can take many forms and because the form of that network is not critical to the present invention.

Figure 6:
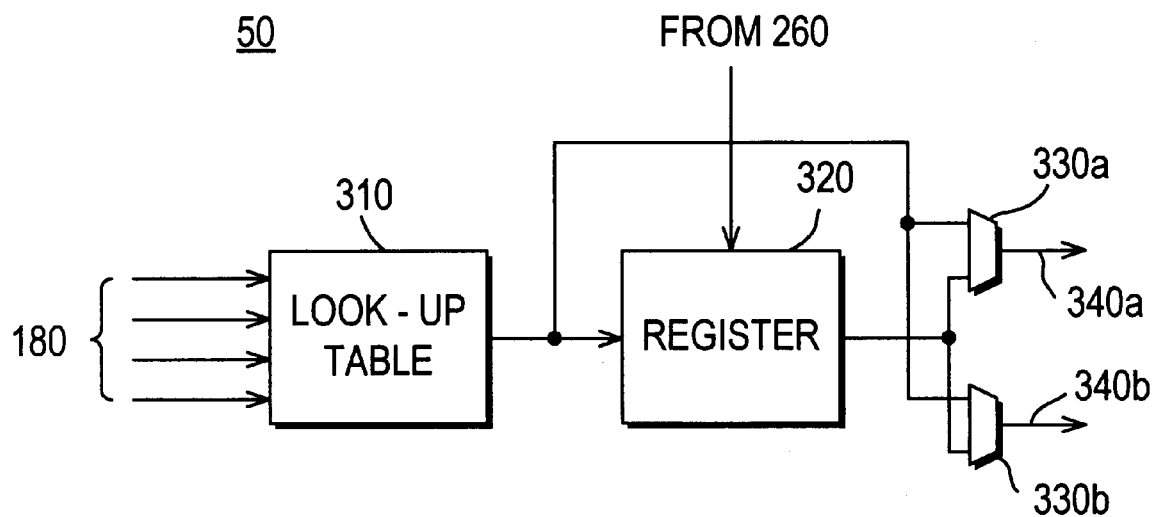
FIG. 6 is a more detailed but still simplified schematic block diagram of a representative portion of the FIG. 1 device showing other aspects of that device.

An illustrative subregion 50 is shown in more detail (although still simplified) in FIG. 6. Further detail regarding possible constructions of subregion 50 can be found in Cliff et al. U.S. patent application Ser. No. 08/902,416, filed Jul. 29, 1997, which is hereby incorporated by reference herein in its entirety. However, such further detail is not believed necessary for an understanding of the present invention.

As shown in FIG. 6, subregion 50 includes a four-input look-up table 310 which is programmable to produce an output signal that is any logical combination of the four input signals 180 applied to the look-up table. The look-up table output signal can be registered by register 320. Secondary signals (e.g., clocks and clears from associated circuitry 260 in FIG. 5) are also applied to register 320. The output signal of register 320 is applied to one input terminal of each of PLCs 330a and 330b. The unregistered output signal of look-up table 310 is applied to the other input terminal of each of PLCs 330a and 330b. Thus each of PLCs 330a and 330b is programmable to produce an output signal 340a or 340b, respectively, which is either the registered or unregistered output signal of look-up table 310.

FIG. 7 shows in more detail that each subregion 50 receives two of its primary inputs 180 from the conductors 160 to its left and the other two of its primary inputs 180 from the conductors 160 to its right. FIG. 7 also shows that each subregion 50 applies one of its primary outputs 340a to the drivers 190/200/270 to its left and the other of its primary outputs 340b to the drivers 190/200/270 to its right. Each driver group 190/200/270 receives outputs 340 from four subregions 50, two to its left and two to its right. The portion 270 of each driver group 190/200/270 produces two local output signals 350a and 350b that are applied to two of the conductors 160b that are adjacent to the region 30 that includes that driver group. Each of output signals 350 is selected from the outputs 340 of two horizontally adjacent subregions 50 (see also FIG. 8 which illustrates this last point more clearly). In half the super-regions 20, circuitry of the type shown in FIG. 7 appears in left/right mirror image from what is shown in FIG. 7.

Figure 8:
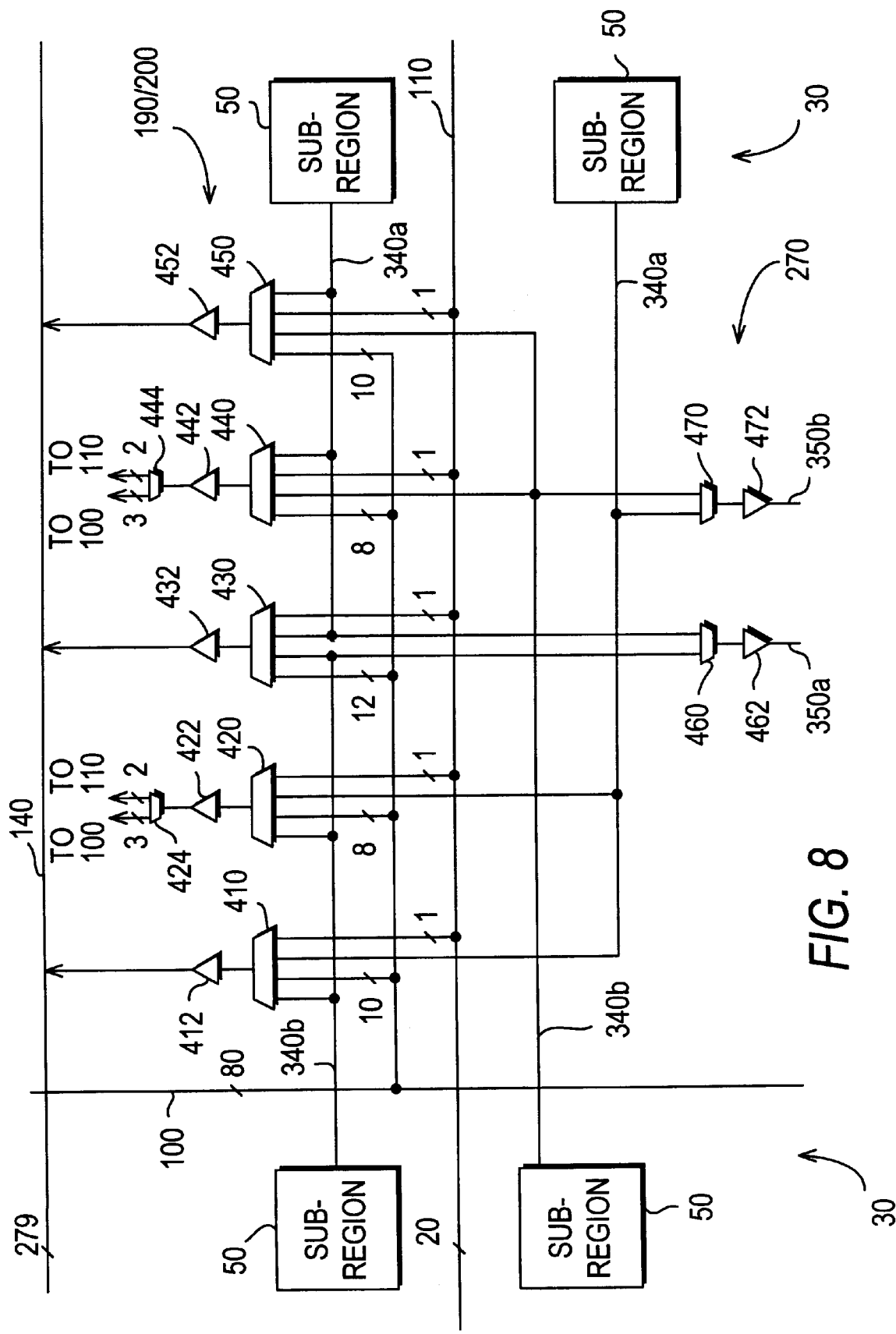
FIG. 8 is a more detailed but still simplified schematic block diagram of portions of the circuitry shown in FIG. 7.

FIG. 8 shows additional details of representative driver groups 190/200/270. For example, PLC 410 is programmable to select one signal from among the output signal 340b of the adjacent upper left subregion 50, the output signal 340a of the adjacent lower right subregion 50, ten adjacent vertical conductor signals 100, and one adjacent horizontal conductor signal 110. The signal selected by PLC 410 is applied to driver 412 and then to an adjacent global conductor 140. PLC 420 is programmable to select one signal from among the output signal 340b of the adjacent upper left subregion 50, the output signal 340a of the adjacent lower right subregion 50, eight adjacent vertical conductor signals 100, and one adjacent horizontal conductor signal 110. The signal selected by PLC 420 is applied to driver 422 and then (via PLC 424) to one of three adjacent vertical conductors 100 or one of two adjacent horizontal conductors 110.

PLC 430 is programmable to select one signal from among the output signal 340b of the adjacent upper left subregion 50, the output signal 340a of the adjacent upper right subregion 50, twelve adjacent vertical conductor signals 100, and one adjacent horizontal conductor signal 110. The signal selected by PLC 430 is applied to driver 432 and then to an adjacent global horizontal conductor 140.

Elements 440, 442, and 444 are generally similar to elements 420, 422, and 424 except that the applied subregion outputs are from the adjacent lower left and upper right subregions 50. Elements 450 and 452 are similar to elements 410 and 412 except that the applied subregion outputs are from the adjacent lower left and upper right subregions 50.

FIG. 8 also shows that local feedback output signal 350a is selected (by PLC 460) from the output 340b of the adjacent upper left subregion 50 and the output 340a of the adjacent upper right subregion 50. Driver 462 strengthens the signal selected by PLC 460. Local feedback output signal 350b is selected (by PLC 470) from the output 340b of the adjacent lower left subregion 50 and the output 340a of the adjacent lower right subregion 50.

It will be noted that FIG. 8 shows upper left and upper right subregions 50 having more ways out to conductors 100, 110, and 140 than lower left and lower right subregions 50. This apparent disparity can be equalized by giving the lower left and lower right subregions more ways out in the driver groups 190/200 to the left and right of the driver group shown in FIG. 8, while the upper left and upper right subregions are given fewer ways out in the driver groups 190/200 to the left and right. By alternating in this way horizontally across the row of regions 30 in each super-region 20, and by also similarly alternating vertically down the columns of subregions 50 in each super-region 20, approximate homogeneity in the output access of all subregions 50 is achieved.

Figure 9:
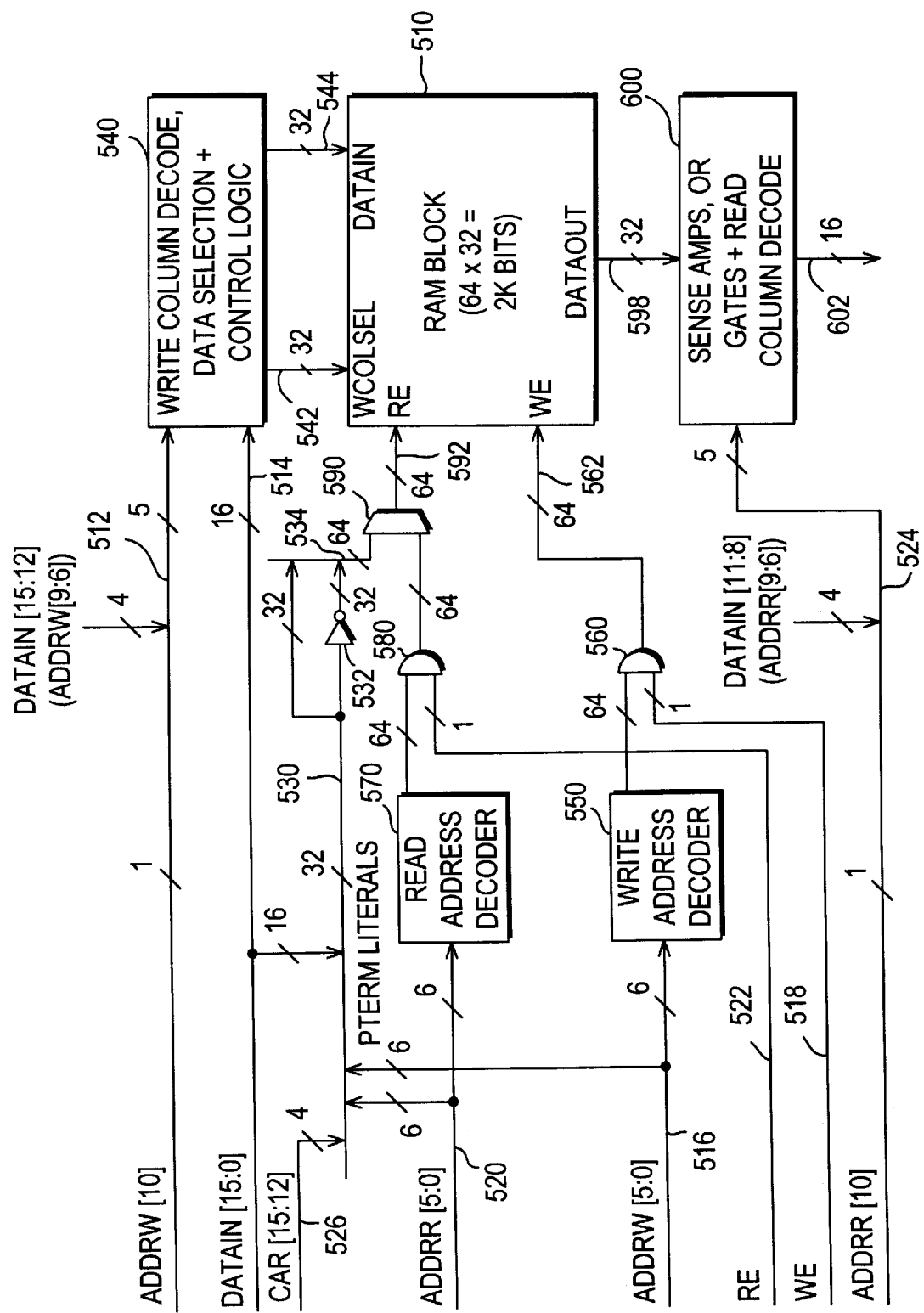
FIG. 9 is a more detailed but still simplified schematic block diagram of a representative portion of the FIG. 1 device showing still other aspects of that device.

A representative memory region 40 is shown in more detail in FIG. 9. Certain principles of memory region construction that are shown and described in Cliff et al. U.S. Pat. No. 5,550,782, Cliff et al. U.S. Pat. No. 5,689,195, and Heile U.S. patent application Ser. No. 09/034,050, filed Mar. 3, 1998, can be used in memory region 40. Thus additional details regarding certain aspects of memory region 40 can be found in those other references, all of which are hereby incorporated by reference herein in their entireties. However, it is not believed that those additional details are necessary for an understanding of the present invention.

The main component of memory region 40 is a block 510 of 64 rows and 32 columns of RAM bits. (Other possible uses of memory region 40 (e.g., for ROM, product term ("p-term") logic, etc.) will be understood to be included by references to RAM.) Circuitries 540 and 600 are each programmable (by associated FCEs that are not shown) to enable memory region 40 to operate in any one of several different word length modes. The word length choices available to the user are one bit, two parallel bits, four parallel bits, eight parallel bits, and 16 parallel bits.

As many as five bits of write address information are applied to circuitry 540 via leads 512. As many as 16 bits of write data are applied to circuitry via leads 514. If a word length less than 16 has been selected, leads 514 that are not needed for data are used for additional read/write column address bits. Circuitry 540 uses the information applied to it via leads 512/514 and its programmed word length state to enable one or more columns of RAM block 510 via leads 542 and to route data from leads 514 to appropriate ones of leads 544. Six additional bits of write address information are applied to write address decoder circuitry 550 via leads 516. Circuitry 550 uses this information to enable one of the 64 rows of RAM block 510 via AND gates 560 and leads 562 when AND gates 560 are enabled by a write enable signal on lead 518. The data applied via leads 544 is thereby stored in RAM block 510 in the column(s) enabled via leads 542 at the row enabled via leads 562.

Memory region 40 can be read in either of two different modes: RAM mode or p-term mode. Considering RAM mode first, six bits of read address information are applied to read address decoder 570 via leads 520. Decoder 570 uses this information to select one of the 64 rows of RAM block 510 when AND gates 580 are enabled by a read enable signal on lead 522. In RAM mode PLCs 590 are programmed to apply the output signals of AND gates 580 to read enable leads 592 of RAM block 510. The data read from the RAM block row that is thus enabled is output via leads 598. Circuitry 600 receives as many as five more bits of read address information via leads 524. Circuitry 600 uses this information and its programmed state (indicative of the word length selection made by the user as described earlier) to select one, two, four, eight, or 16 data bits for output via leads 602.

In p-term mode 32 bits of a so-called "p-term literal" are assembled on leads 530 from the 16 leads 514, the six leads 516, the six leads 520, and four leads 526 that are otherwise used for high order read address signals. As is explained in more detail in above-mentioned Pedersen U.S. patent application Ser. No. 09/023,251, these high order address bits are used when several memory regions 40 in a column are used together to provide a deeper memory than can be provided by one memory region alone. The signals on leads 530 are inverted by inverters 532, and both the true and complement versions of the lead 530 signals are applied to PLCs 590 via leads 534. In p-term mode PLCs 590 are programmed to apply the signals on leads 534 to leads 592. Accordingly, half the rows in RAM block 510 are read simultaneously, the rows thus read being determined by which bits of the p-term literal on leads 530 are logic 1 and which bits are logic 0. Each column in RAM block 510 outputs via the associated lead 598 the product of the data stored in the rows that are enabled. OR gates and related elements in circuitry 600 allow sums of the products on leads 598 to be formed and output via leads 602. Thus in p-term mode memory region 40 produces sum-of-products output signals on leads 602.

Figure 10:
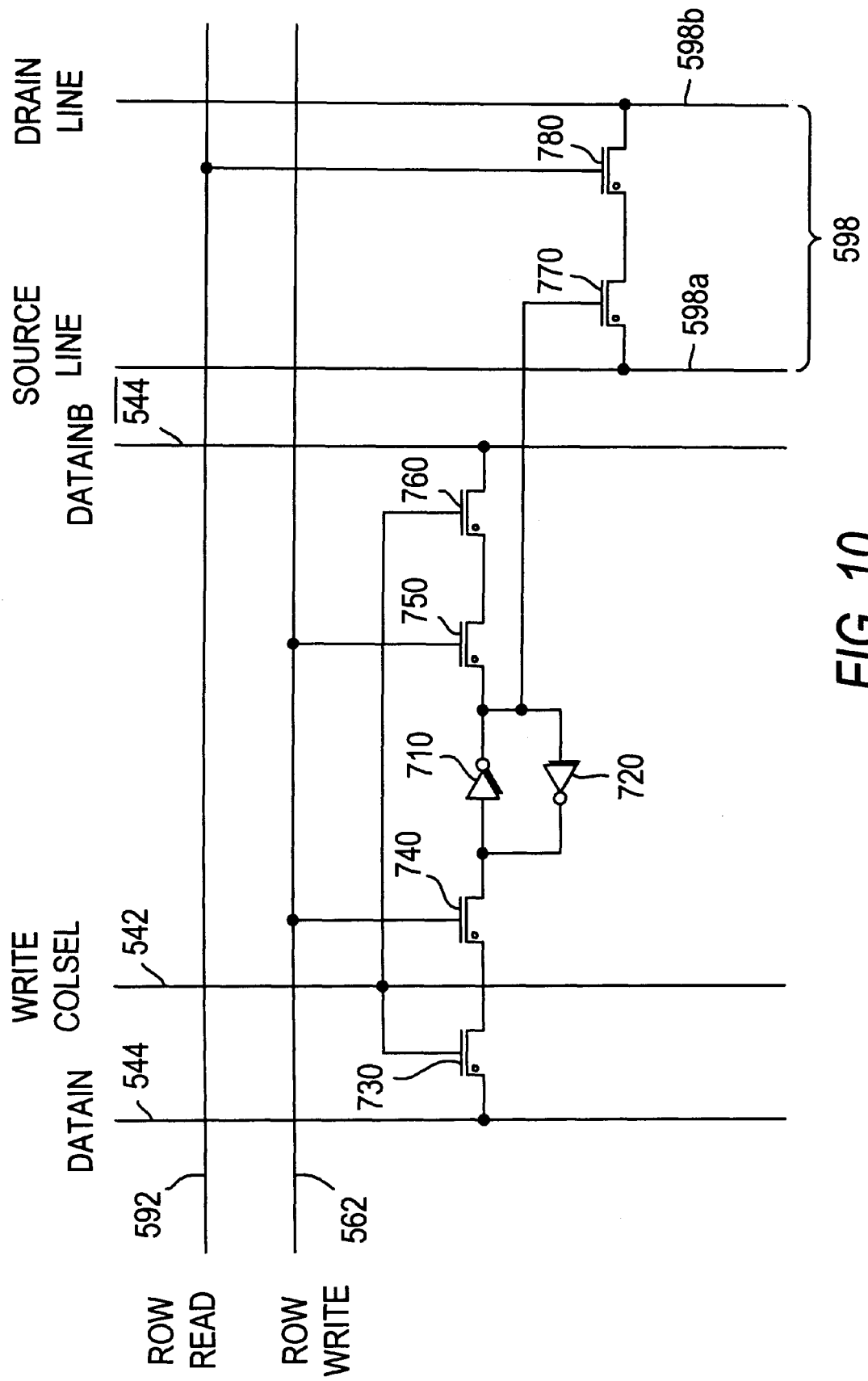
FIG. 10 is a simplified schematic diagram of a representative portion of the FIG. 9 circuitry.

FIG. 10 shows an illustrative construction of one representative memory cell in RAM block 510. Inverters 710 and 720 are connected in a closed loop series to store one bit of data. Data can be written into inverters 710/720 by applying that data in true and complement form to leads 544 and 544 bar, respectively, and by applying logic 1 to write column select lead 542 and row write lead 562. These logic 1 signals enable transistors 730, 740, 750, and 760, thereby causing inverters 710/720 to store the applied data.

Data can be read from inverters 710/720 by applying logic 1 to row read lead 592. This enables transistor 780. If transistor 770 is also enabled by a logic 1 output from inverter 710, a conductive path is established between source line 598a and drain line 598b. A sense amplifier (600 in FIG. 9) senses whether there is such a conductive path between lines 598a and 598b.

Figure 11A:
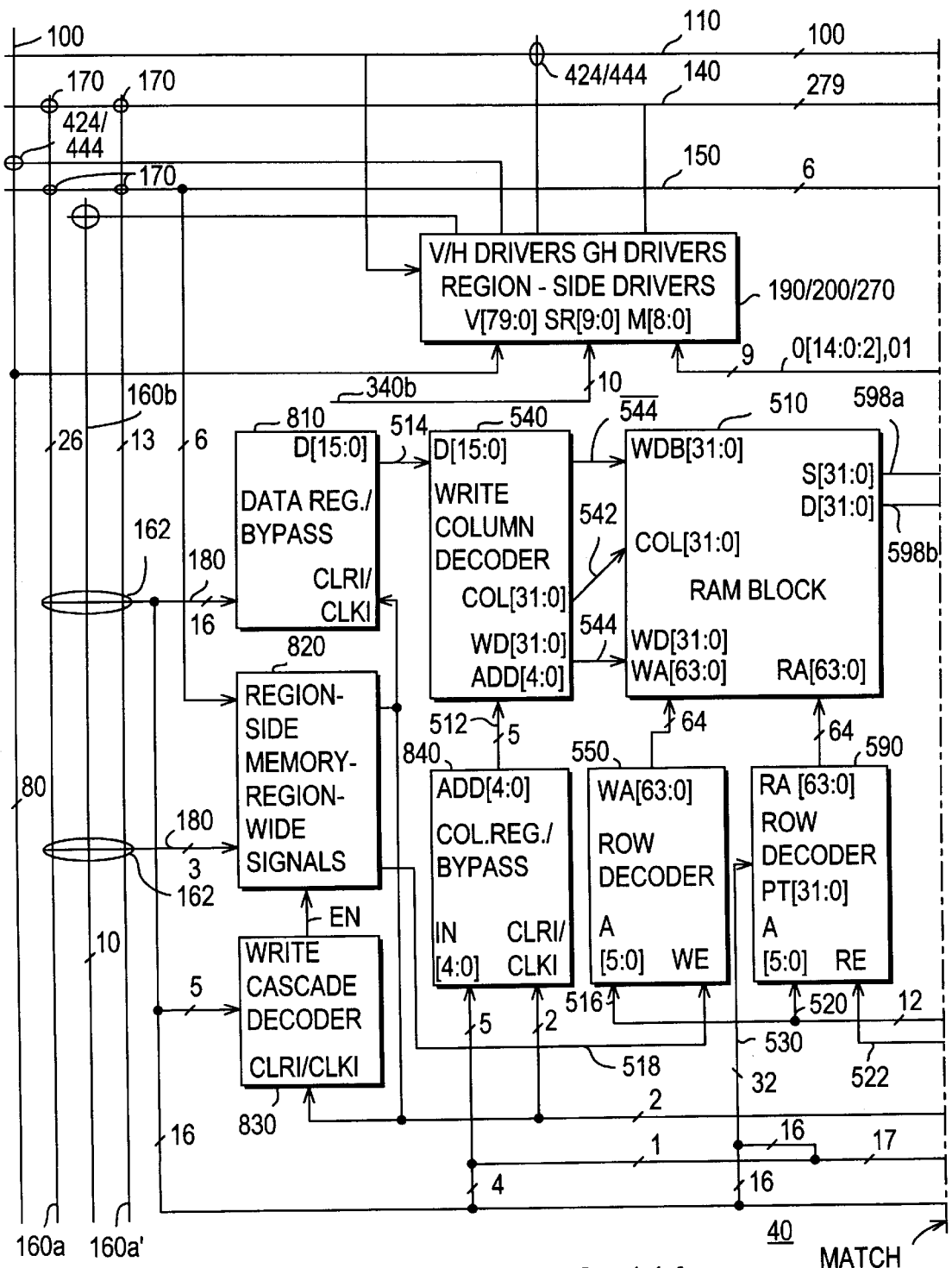
FIG. 11A is a more detailed but still simplified schematic block diagram of the left half of the FIG. 9 circuitry.
Figure 11B:
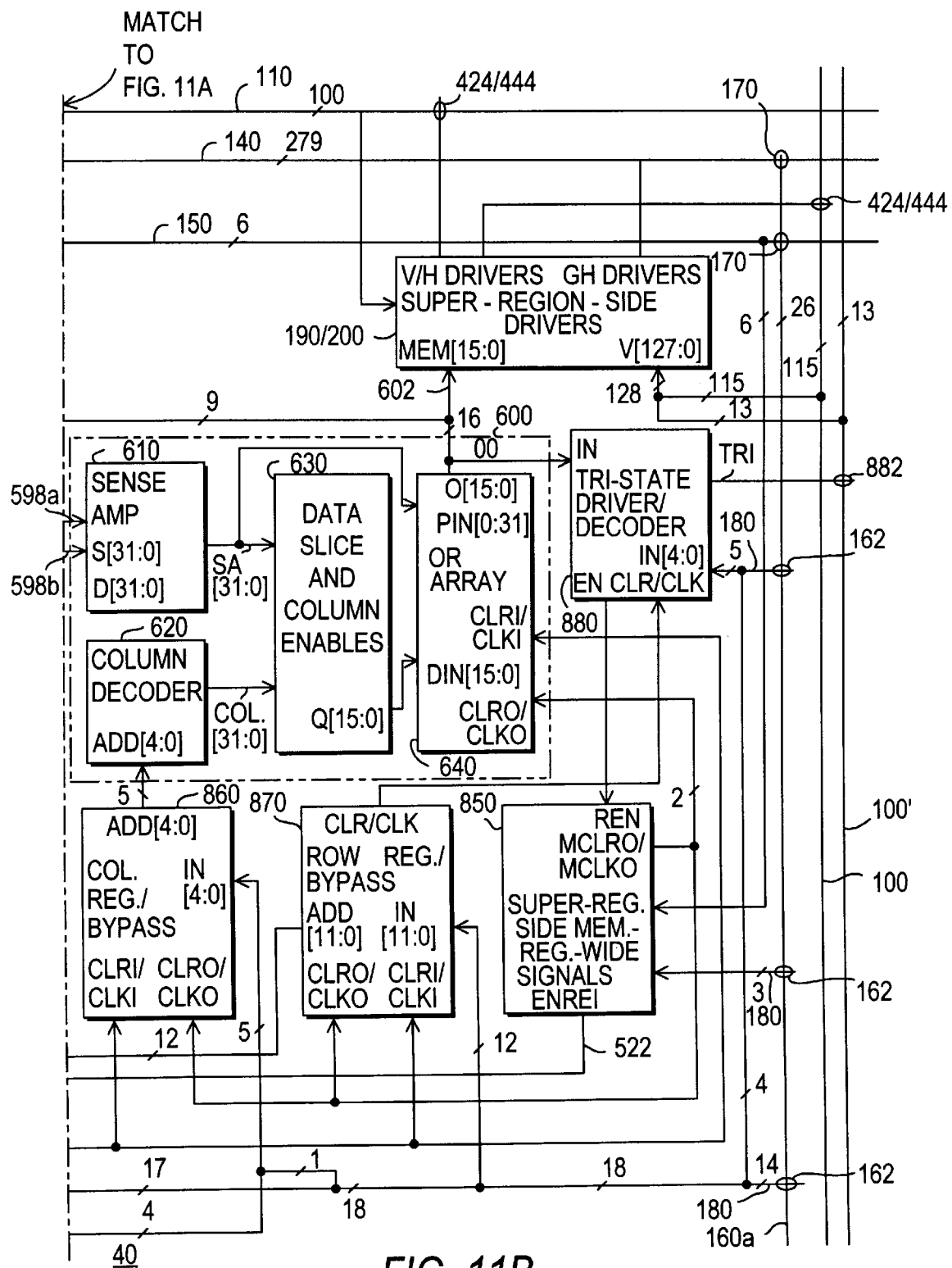
FIG. 11B is a more detailed but still simplified schematic block diagram of the right half of the FIG. 9 circuitry.

FIG. 11A and FIG. 11B shows how a representative memory region 40 is connected to the adjacent interconnection conductors. FIG. 11A and FIG. 11B shows a memory region 40 which is part of a super-region 20 in which the logic regions 30 are to the left of the memory region. If the logic regions 30 were to the right of memory region 40, the circuitry would be a mirror image of FIG. 11A and FIG. 11B. For convenience herein the side of memory region 40 toward the adjacent logic regions 30 is sometimes called the "region side" of the memory region. The side of memory region 40 which is remote from the adjacent logic regions 30 is sometimes called the "super-region side" of the memory region.

The signals that are data signals 514 in FIG. 9 come from circuitry 810 in FIG. 11A. Circuitry 810 is a group of registers that can be either (1) used to register signals from the leads 180 feeding that circuitry from the logic region side of memory region 40, or (2) bypassed to allow unregistered connection of those leads 180 to leads 514. The data applied to RAM block 510 via leads 514 can therefore be either "registered or bypassed", based on programmable control of circuitry 810. The "registered or bypassed" option is also available with other signals in FIG. 11 as will be described below.

Circuitry 820 receives the fast line and clock signals from leads 150, and also receives three more signals from associated leads 180 on the logic region side of memory region 40. A further input to circuitry 820 is an enable signal from circuitry 830, which decodes high order address bits that are used to control writing to a desired one of several memory regions 40 that are being used together to provide a deeper memory than a single memory region can provide. Circuitry 820 is programmable to supply several signals that are based at least in part on the inputs 150 and/or 180 and that are used elsewhere in memory region 40. For example, circuitry 820 supplies clock and clear signals for use by the registers in above-described circuitry 810. Circuitry 820 also provides the write enable signal 518 for row write address decoder circuitry 550.

Circuitry 840 provides a "registered or bypassed" option for the address signals 512 that are used for write column selection by write column decoder circuitry 540. Thus in addition to receiving five address signals, circuitry 540 receives the same clock and clear signals from circuitry 820 that circuitry 810 receives.

Circuitry 850 in FIG. 11B, is similar to circuitry 820, except that it provides signals that can be used elsewhere in memory 40 primarily for output control. For example, circuitry 850 produces clock and clear signals usable by registers in "registered or bypassed" circuitries 860 and 870 and in the output stage 640 of circuitry 600. Each of circuitries 860, 870, and 640 can alternatively use the clock and clear signals from circuitry 820. Circuitry 850 receives its inputs from the super-region side of memory region 40. Circuitry 850 also receives an enable signal from circuitry 880. In providing this enable signal, circuitry 880 operates somewhat like circuitry 830. In particular, when several memory regions 40 are to be used together to provide a deeper memory than one memory region can provide, circuitry 880 receives and decodes higher order address signals to determine whether the associated memory region is the one that should currently output data. If so, circuitry 880 outputs a signal for enabling circuitry 850, which in turn applies read enable signal 522 to circuitry 590.

Circuitry 860 provides a "registered or bypassed" option for the address signals that are used by circuitry 600 for read column selection. Column decoder circuitry 620 in circuitry 600 actually performs this column selection. Further column selection is performed by circuitry 630 on a programmed basis, based on whether the 16-bit, 8-bit, 4-bit, 2-bit, or 1-bit word length is in use. Circuitry 860 is programmable to use the clock and clear signals from either circuitry 820 or from circuitry 850.

Circuitry 870 provides a "registered or bypassed" option for the address bits that are used by circuitry 550 for write row selection and by circuitry 590 for read row selection. Circuitry 870 receives clock and clear signals from both circuitry 820 and circuitry 850. Circuitry 870 also passes along clock and clear signals for use by circuitry 880 in providing a "registered or bypassed" option for the higher-order address bit decoding performed by circuitry 880. Circuitry 880 can be used to apply one output from memory region 40 to one of tri-state vertical conductors 100' via a tri-state driver 210 (FIG. 3) in circuitry 880 and via PLC 882 (e.g., a one-to-four demultiplexer). This feature is typically used when several memory regions 40 are being used together to provide a deeper memory than one memory region can provide by itself. Circuitry 880 decodes the higher-order address bits it receives via leads 180 in order to determine when to enable its tri-state driver 210 (FIG. 3).

Circuitry 640 is programmable to either pass the memory output signals selected by circuitry 630 or to form desired sums of the product terms ("p-terms") represented by the outputs of sense amplifier circuitry 610. Additional details regarding how circuitry 630 can be constructed are shown in above-mentioned Heile U.S. patent application Ser. No. 09/034,050. Thus circuitry 640 includes the OR circuitry needed to form various sums of the applied p-term signals. Circuitry 640 also receives the clock and clear signals from circuitries 820 and 850, and can use these signals in providing a "registered or bypassed" option for either the outputs of circuitry 630 or the sum-of-products signals generated within circuitry 640.

The driver bank 190/200/270 in FIG. 11A (i.e., on the region side of memory region 40) receives (1) subregion output signals 340b from the region 30 to the left, (2) selected outputs 602 of memory region 40, (3) signals from the vertical conductors 100 to the left, and (4) signals from the horizontal conductors 110 associated with the row of super-regions 20 that includes the memory region. This driver bank 190/200/270 is programmable to select from among these signals and drive them out onto selected ones of (1) adjacent local feedback conductors 160b, (2) the immediately above-mentioned vertical conductors 100 and 110, and (3) the global horizontal conductors 140 associated with the super-region 20 that includes the depicted memory region 40.

The driver bank 190/200 in FIG. 11B (i.e., on the super-region side of memory region 40) receives (1) all the outputs 602 of memory region 40, (2) signals from the vertical conductors 100/100' to the right, and (3) signals from the horizontal conductors 110 associated with the row of super-regions 20 that includes the memory region. This driver bank is programmable to select from among these signals and drive them out onto selected ones of the immediately above-mentioned conductors 100 and 110 and the global horizontal conductors 140 associated with the super-region 20 that includes the depicted memory region 40.

FIG. 11A also shows the application of p-term literal signals 530 to circuitry 590. Circuitry 590 therefore also includes the inverters 532 and multiplexing 590 shown in FIG. 9.

Figure 12:
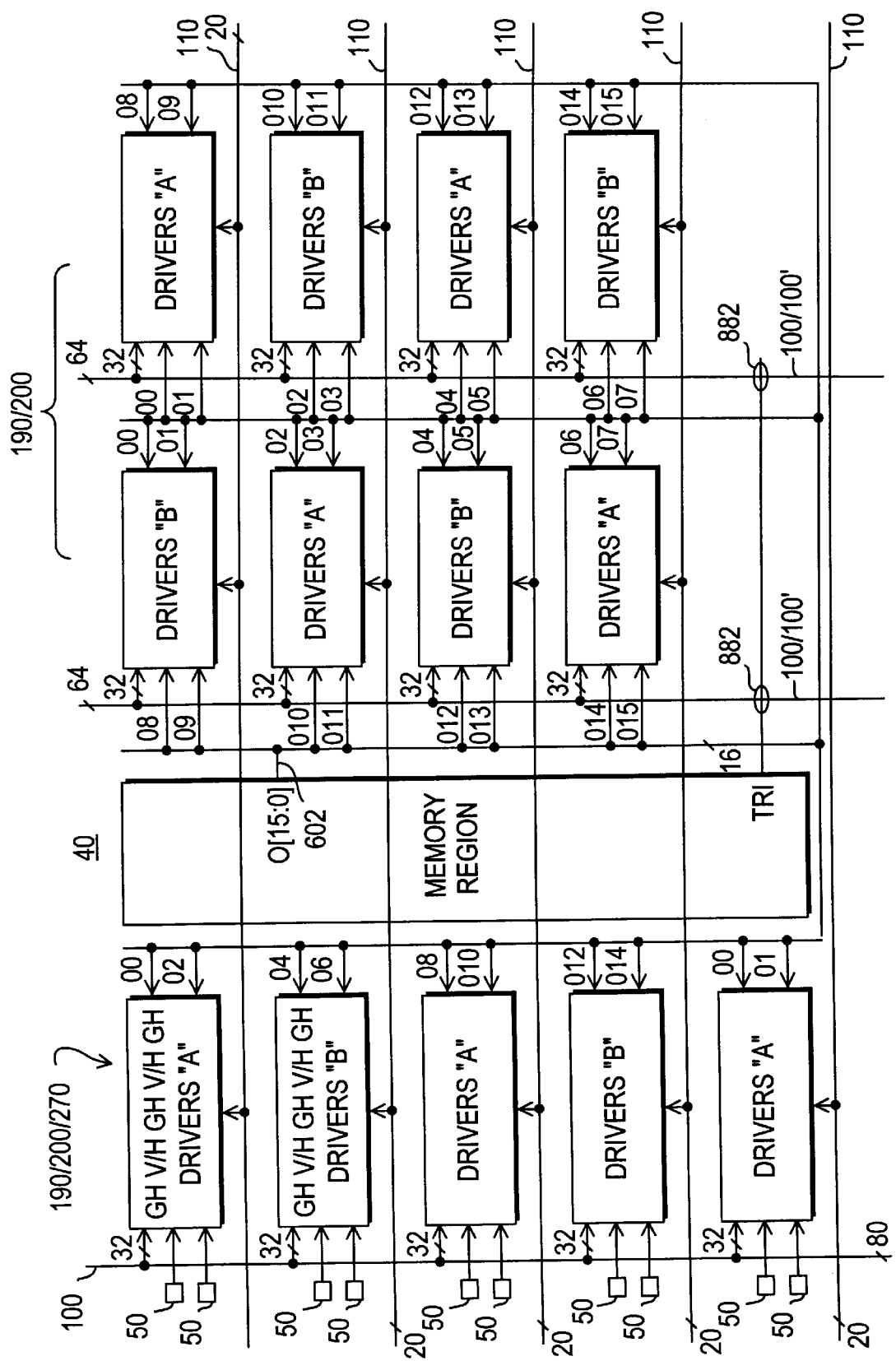
FIG. 12 is a simplified schematic block diagram of a representative portion of the FIG. 1 device showing still further aspects of that device.

FIG. 12 shows in more detail an illustrative construction of the two driver banks 190/200/270 shown in FIG. 11A and 190/200 shown in FIG. 11B. The driver groups labelled "A" in FIG. 12 can be like the driver groups shown in FIG. 8. (The portion 270 of FIG. 8 is included or not in each group A in FIG. 12 depending on whether or not that group has associated local conductors 160*b* that may need to be driven.) The driver groups labelled "B" in FIG. 12 are like the above-described alternative to FIG. 8 that can be alternated with the FIG. 8 driver group to produce approximate overall homogeneity to the interconnectivity provided by these drivers. FIG. 12 shows how the 16 outputs 602 of the memory region are distributed to the inputs of the various driver groups A and B, it being understood that in most cases in FIG. 12 the indicated signals 602 take the place of the correspondingly positioned subregion outputs 340 in FIG. 8. For example, in the upper left-hand driver group A in FIG. 12, the two left-hand inputs from subregions 50 are as in FIG. 8, but the two right-hand inputs are memory region outputs 602 for bit 0 and bit 2. As another example, in the upper right-hand driver group A the two individual inputs on the left are memory region outputs 602 for bit 0 and bit 1 and the two inputs on the right are memory region outputs 602 for bit 8 and bit 9. Sufficient connectivity is provided in FIG. 12 to give each memory region output 602 several different ways out to the adjacent conductors 100, 110, and 140. FIG. 12 also shows again the tri-state output to conductors 100' via PLCs 882.

From the foregoing it will be seen that the programmable logic device architectures of this invention provide a memory region 40 in association with each group of logic regions 30 on the device. Each memory region 40 can be used in conjunction with the associated logic regions 30 via relatively local interconnection resources such as conductors 140 and 160. In general, for such use of a memory region 40 with its associated logic regions 30, it is not necessary to involve more expensive, longer-length interconnection resources such as conductors 100 and 110. Although logic regions 30 and memory regions 40 are thus associated with one another in super-regions 20, all such regions can also function as global resources of the device. In particular, all logic regions 30 and memory regions 40 also have access to interconnection resources such as conductors 100 and 110 that span the device. Thus the inputs and outputs of any region 30 or 40 on the device can be connected to the inputs and outputs of substantially any other regions 30 and 40 on the device.

Figure 13:
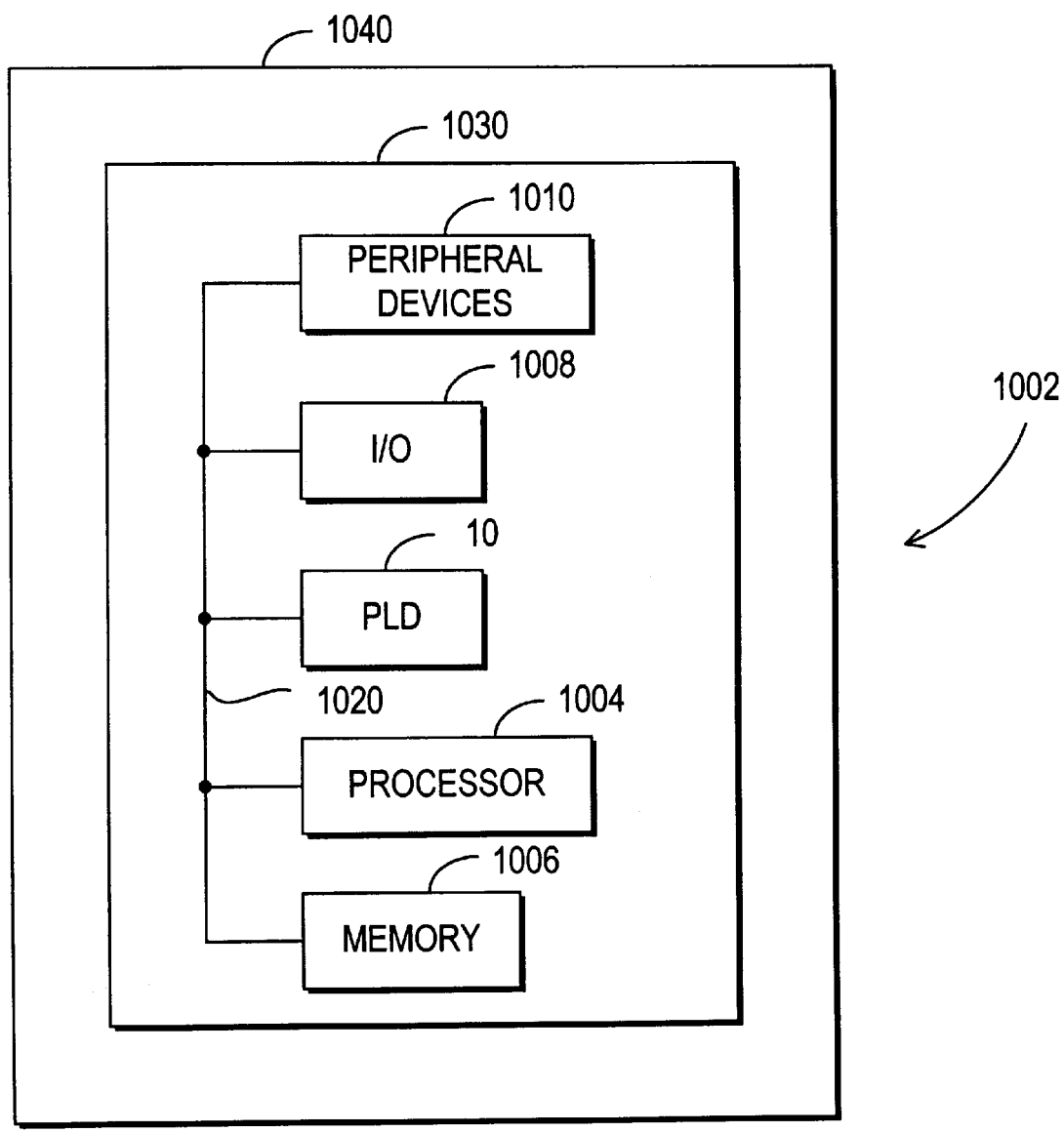
FIG. 13 is a simplified block diagram of an illustrative system employing a programmable logic device in accordance with the invention.

FIG. 13 illustrates a programmable logic device 10 of this invention in a data processing system 1002. Data processing system 1002 may include one or more of the following components: a processor 1004; memory 1006; I/O circuitry 1008; and peripheral devices 1010. These components are coupled together by a system bus 1020 and are populated on a circuit board 1030 which is contained in an end-user system 1040.

System 1002 can be used in a wide variety of applications, such as computer networking, data networking, instrumentation, video processing, digital signal processing, or any other application where the advantage of using programmable or reprogrammable logic is desirable. Programmable logic device 10 can be used to perform a variety of different logic functions. For example, programmable logic device 10 can be configured as a processor or controller that works in cooperation with processor 1004. Programmable logic device 10 may also be used as an arbiter for arbitrating access to a shared resource in system 1002. In yet another example, programmable logic device 10 can be configured as an interface between processor 1004 and one of the other components in system 1002. It should be noted that system 1002 is only exemplary, and that the true scope and spirit of the invention should be indicated by the following claims.

Various technologies can be used to implement the programmable logic devices of this invention, as well as the various components of those devices (e.g., the above-described PLCs and the FCEs which control the PLCs). For example, each PLC can be a relatively simple programmable connector such as a switch or a plurality of switches for connecting any one of several inputs to an output. Alternatively, each PLC can be a somewhat more complex element which is capable of performing logic (e.g., by logically combining several of its inputs) as well as making a connection. In the latter case, for example, each PLC can be product term logic, implementing functions such as AND, NAND, OR, or NOR. Examples of components suitable for implementing PLCs are EPROMs, EEPROMs, pass transistors, transmission gates, antifuses, laser fuses, metal optional links, etc. As has been mentioned, the components of PLCs can be controlled by various, programmable, function control elements ("FCEs"). (With certain PLC implementations (e.g., fuses and metal optional links) separate FCE devices are not required.) FCEs can also be implemented in any of several different ways. For example, FCEs can be SRAMs, DRAMs, first-in first-out ("FIFO") memories, EPROMs, EEPROMs, function control registers (e.g., as in Wahlstrom U.S. Pat. No. 3,473,160), ferroelectric memories, fuses, antifuses, or the like. From the various examples mentioned above it will be seen that this invention is applicable to both one-time-only programmable and reprogrammable devices.

It will be understood that the foregoing is only illustrative of the principles of the invention, and that various modifications can be made by those skilled in the art without departing from the scope and spirit of the invention. For example, the number of logic units at each of the various levels in the hierarchy of logic units can differ from the specific examples mentioned herein. Similarly, the numbers of the various types of interconnection conductors and other elements can deviate from the specific examples mentioned herein. Different types and sizes of logic and memory units can be used if desired. It will also be understood that terms like "row" and "column", "horizontal" and "vertical", "left" and "right", "top" and "bottom", and other directional or orientational terms are used herein only for convenience, and that no fixed or absolute orientations are intended by the use of these terms. For example, the words in each of the word pairs mentioned above can be reversed if desired.

What is claimed is:

1. A programmable logic device comprising:

a plurality of super-regions disposed on the programmable logic device in a two-dimensional array of intersecting rows and columns of such super-regions, each of said super-regions including a plurality of regions of programmable logic and a region of memory, each of said programmable logic regions having a plurality of inputs and a plurality of outputs and being programmable to perform any of several logic functions on its inputs to produce its outputs, and said memory region also having a plurality of inputs and a plurality of outputs and being responsive to its inputs to produce its outputs based at least in part on its inputs and data stored in the memory region; and programmable interconnection circuitry for selectively connecting said outputs of said programmable logic regions and said memory regions to said inputs of said programmable logic regions and said memory regions, wherein, for each of the super-regions, the programmable interconnection circuitry comprises:

a plurality of first interconnection conductors uniquely associated with that super-region, each of the first interconnection conductors that is associated with a super-region extending substantially continuously adjacent to all of the logic and memory regions in that super-region and being connectable only to the logic and memory regions in that super-region.

2. The programmable logic device defined in claim 1 wherein each of said programmable logic regions includes a plurality of subregions of programmable logic, each of said subregions having a subplurality of the inputs and at least one of the outputs of the said programmable logic region that includes that subregion, and each subregion being programmable to perform any of a plurality of logic functions on its input to produce its output.

3. The programmable logic device defined in claim 1 wherein each of the memory regions is programmably configurable to provide output signals in parallel on a plurality of different numbers of its outputs.

4. The programmable logic device defined in claim 1 wherein each of the memory regions is programmably configurable to operate in a selected one of a random access memory mode and a product-term mode.

5. A digital processing system comprising:
processing circuitry;
a memory coupled to said processing circuitry; and
a programmable logic device as defined in claim 1 coupled to the processing circuitry and the memory.

6. A printed circuit board on which is mounted a programmable logic device as defined in claim 1.

7. The printed circuit board defined in claim 6 further comprising:
a memory mounted on the printed circuit board and coupled to the programmable logic device.

8. The printed circuit board defined in claim 6 further comprising:
processing circuitry mounted on the printed circuit board and coupled to the programmable logic device.

9. A programmable logic device comprising:
a plurality of super-regions disposed on the programmable logic device in a two-dimensional array of intersecting rows and columns of such super-regions, each of said super-regions including a plurality of regions of programmable logic and a region of memory, each of said programmable logic regions having a plurality of inputs and a plurality of outputs and being programmable to perform any of several logic functions on its inputs to produce its outputs, and said memory region also having a plurality of inputs and a plurality of outputs and being responsive to its inputs to produce its outputs based at least in part on its inputs and data stored in the memory region; and
programmable interconnection circuitry for selectively connecting said outputs of said programmable logic regions and said memory regions to said inputs of said programmable logic regions and said memory regions, wherein, for each of the super-regions, the programmable interconnection circuitry comprises:
a plurality of first interconnection conductors uniquely associated with that super-region, each of the first interconnection conductors that is associated with a super-region extending substantially continuously adjacent to all of the regions in that super-region, wherein the interconnection circuitry further comprises:
a plurality of second interconnection conductors extending along each of said rows of super-regions; and
a plurality of third interconnection conductors extending along each of said columns of super-regions.

10. The programmable logic device defined in claim 9 wherein, for each of the super-regions, the programmable interconnection circuitry further comprises:
fifth programmable logic connectors configured to selectively connect at least some of the first interconnection conductors associated with that super-region to at least some of the second interconnection conductors that extend along the row that includes that super-region.

11. The programmable logic device defined in claim 9 wherein, for each of the super-regions, the programmable interconnection circuitry further comprises:
sixth programmable logic connectors configured to selectively connect at least some of the first interconnection conductors associated with that super-region to at least some of the third interconnection conductors that extend along the column that includes that super-region.

12. The programmable logic device defined in claim 9 wherein, for each of the super-regions, the programmable interconnection circuitry further comprises:
eighth programmable logic connectors configured to selectively connect at least some of the outputs of the memory region of that super-region to at least some of the second interconnection conductors that extend along the row that includes that super-region.

13. The programmable logic device defined in claim 9 wherein, for each of the super-regions, the programmable interconnection circuitry further comprises:
ninth programmable logic connectors configured to selectively connect at least some of the outputs of the memory region of that super-region to at least some of the second interconnection conductors that extend along the column that includes that super-region.

14. A programmable logic device comprising:
a plurality of super-regions disposed on the programmable logic device in a two-dimensional array of intersecting rows and columns of such super-regions, each of said super-regions including a plurality of regions of programmable logic and a region of memory, each of said programmable logic regions having a plurality of inputs and a plurality of outputs and being programmable to perform any of several logic functions on its inputs to produce its outputs, and said memory region also having a plurality of inputs and a plurality of outputs and being responsive to its inputs to produce its outputs based at least in part on its inputs and data stored in the memory region; and
programmable interconnection circuitry for selectively connecting said outputs of said programmable logic regions and said memory regions to said inputs of said programmable logic regions and said memory regions, wherein, for each of the super-regions, the programmable interconnection circuitry comprises:
a plurality of first interconnection conductors uniquely associated with that super-region, each of the first interconnection conductors that is associated with a super-region extending substantially continuously adjacent to all of the regions in that super-region, wherein each of said programmable logic regions includes a plurality of subregions of programmable logic, each of said subregions having a subplurality of the inputs and at least one of the outputs of the said programmable logic region that includes that subregion, and each subregion being programmable to perform any of a plurality of logic functions on its input to produce its output.

15. The programmable logic device defined in claim 14 wherein, for each of a multiplicity of subpluralities of said subregions in each of said super-regions, said programmable interconnection circuitry further comprises:

a plurality of fourth interconnection conductors associated with that subplurality, each of the fourth interconnection conductors that is associated with a subplurality extending substantially continuously adjacent to all of the subregions in that subplurality.

16. The programmable logic device defined in claim 15 wherein said programmable interconnection circuitry further comprises:

first programmable logic connectors configured to selectively connect the inputs of each subregion to at least some of the fourth interconnection conductors that are associated with the subplurality that includes that subregion.

17. The programmable logic device defined in claim 15 wherein said programmable interconnection circuitry further comprises:

second programmable logic connectors configured to selectively connect at least some of the fourth interconnection conductors that are associated with each of said subpluralities of subregions to at least some of the first interconnection conductors that are associated with the regions that include those subregions.

18. The programmable logic device defined in claim 15 wherein, for each of the subpluralities, said programmable interconnection circuitry further comprises:

a plurality of fifth interconnection conductors associated with that subplurality, each of the fifth interconnection conductors that is associated with a subplurality extending substantially continuously adjacent to all of the subregions in that subplurality; and third programmable logic connectors configured to selectively connect the output of each of said subregions to at least one of the fifth interconnection conductors that is associated with the subplurality that includes that subregion.

19. The programmable logic device defined in claim 18 wherein said programmable interconnection circuitry further comprises:

fourth programmable logic connectors configured to selectively connect the inputs of each subregion to at least some of the fifth interconnection conductors that are associated with the subplurality that includes that subregion.

20. A programmable logic device comprising:

a plurality of super-regions disposed on the programmable logic device in a two-dimensional array of intersecting rows and columns of such super-regions, each of said super-regions including a plurality of regions of programmable logic and a region of memory, each of said programmable logic regions having a plurality of inputs and a plurality of outputs and being programmable to perform any of several logic functions on its inputs to produce its outputs, and said memory region also having a plurality of inputs and a plurality of outputs and being responsive to its inputs to produce its outputs based at least in part on its inputs and data stored in the memory region; and programmable interconnection circuitry for selectively connecting said outputs of said programmable logic regions and said memory regions to said inputs of said programmable logic regions and said memory regions, wherein, for each of the super-regions, the programmable interconnection circuitry comprises:

a plurality of first interconnection conductors uniquely associated with that super-region, each of the first interconnection conductors that is associated with a super-region extending substantially continuously adjacent to all of the regions in that super-region, wherein, for each of the super-regions, the programmable interconnection circuitry further comprises:

seventh programmable logic connectors configured to selectively connect at least some of the outputs of the memory region of that super-region to at least some of the first interconnection conductors associated with that super-region.

* * * * *